United States Patent
Stoops et al.

(10) Patent No.: US 9,172,362 B2
(45) Date of Patent: Oct. 27, 2015

(54) MULTIFUNCTION WORD RECOGNIZER ELEMENT

(71) Applicant: Tektronix, Inc., Beaverton, OR (US)

(72) Inventors: John F. Stoops, Portland, OR (US); Daniel G. Knierim, Beaverton, OR (US)

(73) Assignee: TEKTRONIX, INC., Beaverton, OR (US)

( * ) Notice: Subject to any disclaimer, the term of this patent is extended or adjusted under 35 U.S.C. 154(b) by 0 days.

(21) Appl. No.: 13/922,125

(22) Filed: Jun. 19, 2013

(65) Prior Publication Data
US 2013/0278291 A1 Oct. 24, 2013

Related U.S. Application Data

(62) Division of application No. 12/355,038, filed on Jan. 16, 2009, now Pat. No. 8,531,209.

(51) Int. Cl.
| H03K 5/22 | (2006.01) |
| H03K 5/24 | (2006.01) |
| G01R 31/3177 | (2006.01) |
| G01R 13/02 | (2006.01) |

(52) U.S. Cl.
CPC .......... *H03K 5/2481* (2013.01); *G01R 31/3177* (2013.01); *G01R 13/0254* (2013.01)

(58) Field of Classification Search
CPC .... H03K 5/2481; H03K 5/08; H03F 3/45183; H04L 25/0272
See application file for complete search history.

(56) References Cited

U.S. PATENT DOCUMENTS

| 4,495,603 A * | 1/1985 | Varshney ................. 365/233.11 |
| 5,510,734 A * | 4/1996 | Sone .................................. 327/65 |
| 5,550,528 A | 8/1996 | Offord et al. |
| 6,633,838 B1 | 10/2003 | Arimilli et al. |
| 6,924,705 B2 * | 8/2005 | Huang ............................. 331/10 |
| 7,096,395 B2 | 8/2006 | Litt |
| 7,272,528 B2 | 9/2007 | Holaday et al. |
| 2003/0126502 A1 | 7/2003 | Litt |
| 2004/0257125 A1 * | 12/2004 | Cheng et al. ................. 327/108 |
| 2006/0083268 A1 | 4/2006 | Holaday et al. |
| 2009/0179672 A1 * | 7/2009 | Washkurak .................. 327/108 |

FOREIGN PATENT DOCUMENTS

| EP | 0241616 A1 | 10/1987 |
| EP | 0367345 A1 | 5/1990 |
| FR | 2457495 A1 | 12/1980 |

OTHER PUBLICATIONS

European Search Report and Written Opinion for Application No. 10250061.8, dated May 11, 2012, 5 pages.

* cited by examiner

*Primary Examiner* — Sibin Chen
(74) *Attorney, Agent, or Firm* — Marger Johnson; Thomas F. Lenihan

(57) ABSTRACT

A circuit includes a load; a first differential pair coupled to the load and responsive to input data; a second differential pair coupled to the load and responsive to the input data; a third differential pair coupled to the first differential pair and the second differential pair and responsive to a first control signal and a second control signal; a bias circuit configured to pull a node coupled to both the first differential pair and the second differential pair to a predetermined state; and a current source coupled to the third differential pair and the bias circuit.

15 Claims, 3 Drawing Sheets ved by the do-not-care bits can be combined together in logic circuitry to generate a signal indicating whether the trigger condition word occurred in the input word.

MULTIFUNCTION WORD RECOGNIZER ELEMENT

RELATED APPLICATION DATA

This application is a divisional of copending U.S. patent application Ser. No. 12/355,038, filed Jan. 16, 2009, now U.S. Pat. No. 8,531,209 B2, issued Sep. 10, 2013, herein incorporated by reference.

FIELD OF THE INVENTION

This disclosure relates to word recognizer elements and, in particular to multifunction word recognizer elements and test and measurement instruments including the same.

BACKGROUND OF THE INVENTION

In a test and measurement instrument, a word can be used as a condition for a trigger. For example, a trigger can be generated on the occurrence of a particular digital word on a probed data bus of a device under test. To generate such a trigger, digital comparators can be used to detect when two digital words match. Such circuitry can be implemented using discrete logic gates. For example, an input word can be bit-wise exclusive-NOR'ed with a trigger condition word. For each of the resulting outputs, a do-not-care bit can be combined in a second logic gate. The resulting outputs, modified by the do-not-care bits can be combined together in logic circuitry to generate a signal indicating whether the trigger condition word occurred in the input word.

However, the above implementation results in at least a three gate delay through the word recognizer. Additionally, delay differences (skew) in the data bus, the probes, and/or the logic gates in the word recognizer may result in false recognition of a word when multiple bits of the data bus change substantially simultaneously.

SUMMARY

An embodiment includes a circuit including a load; a first differential pair coupled to the load and responsive to input data; a second differential pair coupled to the load and responsive to the input data; a third differential pair coupled to the first differential pair and the second differential pair and responsive to a first control signal and a second control signal; a bias circuit configured to pull a node coupled to both the first differential pair and the second differential pair; and a current source coupled to the third differential pair and the bias circuit.

Another embodiment includes a test and measurement instrument including acquisition circuitry configured to acquire a plurality of data signals; a plurality of word recognizer elements, each word recognizer element configured to compare a corresponding one of the data signals with a desired data bit and each word recognizer element having a delay less than or equal to about one gate delay; a logic circuit to combine outputs of the word recognizer elements; and a trigger circuitry responsive to the logic circuit.

DETAILED DESCRIPTION

Figure 1:
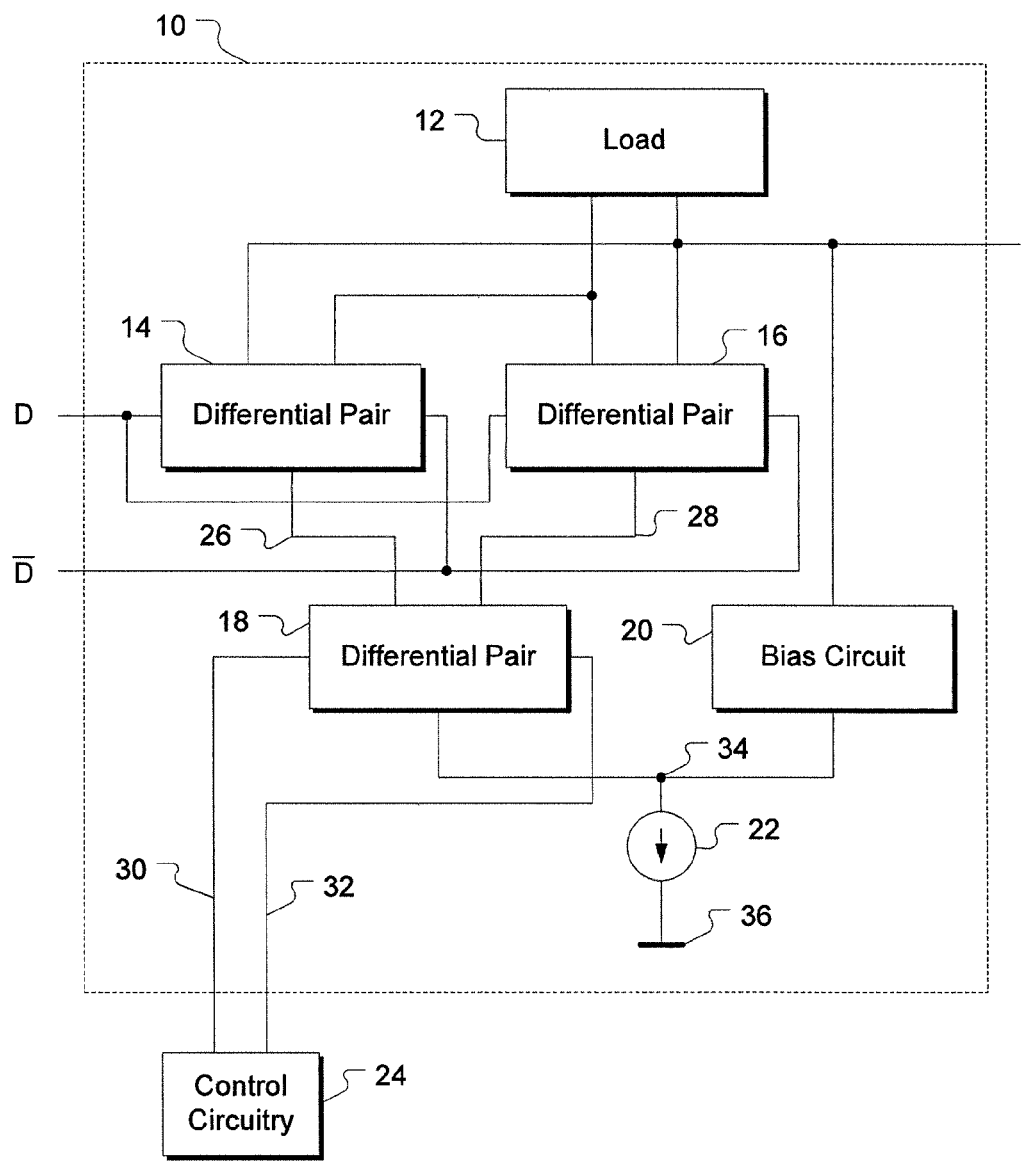
FIG. 1 is a block diagram of a multifunction word recognizer element according to an embodiment.

FIG. 1 is a block diagram of a multifunction word recognizer element according to an embodiment. The word recognizer element 10 includes a load 12, a first differential pair 14, a second differential pair 16, a third differential pair 18, a bias circuit 20, and a current source 22. The first differential pair 14 and the second differential pair 16 are each responsive to input data D. In this embodiment, the first differential pair 14 and the second differential pair 16 are also responsive to complementary input data /D, however, the first differential pair 14 and the second differential pair 16 can also have an alternative input, such as a threshold, instead of the complementary input data /D. Moreover, although a particular connection of the input data D and complementary input data /D has been illustrated, the first differential pair 14 and the second differential pair 16 can be configured to operate as desired according to logic levels, transistor types, or the like.

The first differential pair 14 and the second differential pair 16 are coupled to the load. Each of the differential pairs 14 and 16 include differential outputs. These differential outputs are cross-coupled to the load 12.

The third differential pair 18 also has differential outputs. A first output 26 of the third differential pair 18 is coupled to a common node of the first differential pair 14. A second output 28 is coupled to a common node of the second differential pair 16. The third differential pair 18 is responsive to a first control signal 30 and a second control signal 32.

In an embodiment, the differential pairs 14, 16, and 18 can be formed from identical transistor pairs. In another embodiment, as will be further described below, the first differential pair 14 and the second differential pair 16 can be formed from higher speed transistors while the third differential pair can be formed from lower speed transistors.

The differential pairs 14, 16, and 18 can be formed from any variety of transistors. For example, the differential pairs 14, 16, and 18 can each be differential bi-polar transistors with the collectors as the outputs, the bases as the differential inputs, and commonly coupled emitters as the common node.

The load 12 can be any variety of load. For example, the load can be a pair of resistors, a current mirror, or the like. Any kind of load that can be used as a load for a differential amplifier can be used as the load 12.

The bias circuit 20 can be configured to pull a node coupled to both the first differential pair 14 and the second differential pair 16. The node can be a node common between the first and second differential pairs 14 and 16. As will be described below, the node can alternatively be a node of the load 12.

A current source 22 is coupled to the third differential pair 18 and the bias circuit 20. The current source 22 can be implemented in a variety of ways. For example, the current source can be a resistor coupled between the node 34 and the power supply terminal 36. In another embodiment, the current source 22 can be a transistor that is part of a current mirror. Regardless of the form, current from the current source 22 can be directed towards the bias circuit 20 or the differential pair 18.

Control circuitry 24 can be coupled to the third differential pair 18. The control circuitry 24 is configured to generate a first control signal 30 and a second control signal 32. The control circuitry 24 can be any variety of circuitry. For example, the control circuitry 24 can include devices such as a programmable gate array, a processor, discrete logic, or the like.

In an embodiment, the first control signal 30 can be referred to as a control signal W. The second control signal can be referred to as a control signal V. Control signals W and V are given by equations (1) and (2):

$$W = P\overline{X} \quad (1)$$

$$V = \overline{PX} \quad (2)$$

Here, P is a desired data signal. For example, desired data signal P can be a bit which, if matching input data, can contribute to a match of a word. X is a do-not-care signal. Thus, control signal W can be a logical AND of the desired data signal P and the inverse of the do-not-care signal X while the control signal V can be the logical AND of the inverse of the desired data signal P and the inverse of the do-not-care signal X.

In an embodiment, depending on control signals W and V, the third differential pair 18 can be configured such that current flowing through the third differential pair 18 can be directed alternately towards the first output 26 or the second output 28. For example, assuming that the do-not-care signal X is low, control signals W and V follow desired data signal P and the inverse of desired data signal P, respectively. As a result, desired data signal P can be used to direct current flowing through the third differential pair 18 toward the first differential pair 14 or the second differential pair 16.

The bias circuit 20 can be configured such that if the do-not-care signal X is asserted, the current from the current source 22 is directed towards the bias circuit 20. Accordingly, in the do-not-care condition, the bias circuit 20 can be configured to pull the output node to a particular state. For example, the bias circuit 20 can pull the output node to a state indicating that there is not a mismatch, so that any subsequent uses of the output of the word recognizer element 10 will not negate a match while the do-not-care signal X is asserted. However, the state need not be a matching state. The state can be any state such that the usage of the output of the word recognizer element 10 does not affect a subsequent result, regardless of how outputs of word recognizer element are combined.

In an embodiment, the bias circuit 20 need not be directly responsive to the do-not-care signal X. As will be further described below, the bias circuit 20 can be configured to be indirectly responsive to such a signal through its connection to other circuitry, such as the third differential pair 18.

Figure 2:
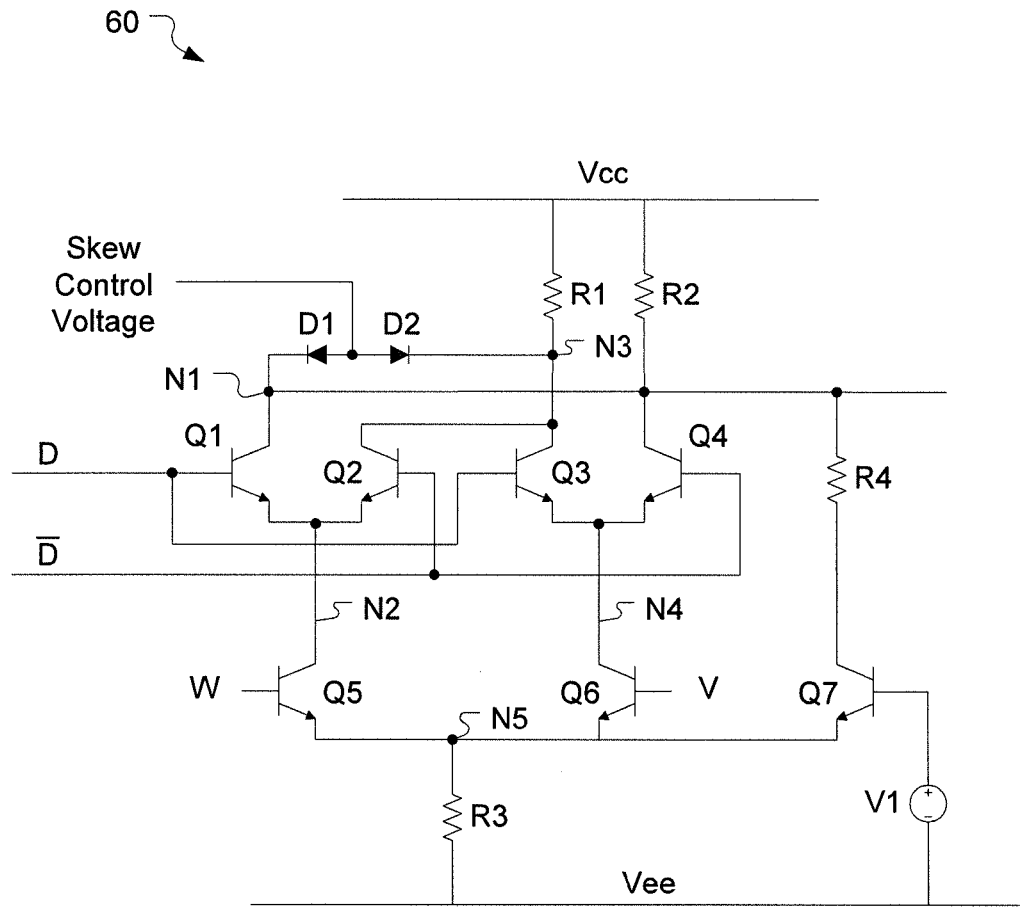
FIG. 2 is a schematic of an example of the multifunction word recognizer element of FIG. 1 with a variable delay.

FIG. 2 is a schematic of an example of the multifunction word recognizer element of FIG. 1. The word recognizer is a circuit 60, including a first transistor Q1, a second transistor Q2, a third transistor Q3, a fourth transistor Q4, a fifth transistor Q5, a sixth transistor Q6, and a seventh transistor Q7. The first transistor Q1 is coupled between a first node N1 and a second node N2 and is responsive to a data signal D. The second transistor Q2 is coupled between a third node N3 and the second node N2 and is responsive to an inverted data signal /D. The third transistor Q3 is coupled between the third node N3 and a fourth node N4 and is responsive to the data signal D. The fourth transistor Q4 is coupled between the first node Ni and the fourth node N4 and is responsive to the inverted data signal /D. The fifth transistor Q5 is coupled between the second node N2 and a fifth node N5 and is responsive to a first control signal W. The sixth transistor Q6 is coupled between the fourth node N4 and the fifth node N5 and is responsive to a second control signal V. The seventh transistor Q7 is coupled between the first node N1, the fifth node N5, and a voltage source V1.

Resistors R1 and R2 are coupled between nodes Ni and N3, and power supply Vcc. The resistors R1 and R2 form a load for the differential pairs formed by transistor pair Q1 and Q2, and transistor pair Q3 and Q4.

In an embodiment, transition frequencies ($f_t$) of the fifth, sixth, and seventh transistors Q5-7 can be less than the $f_t$ of first through fourth transistors Q1-4. For example, $f_t$ of the fifth, sixth, and seventh transistors Q5-7 can be less than half of transition frequencies of the first through fourth transistor Q1-4. In a discrete logic circuit, switching transistors must have the highest $f_t$ to provide the highest speed. As the input data D can be switching at a high speed, transistors Q1-4 can have a higher $f_t$. However, in operation, the desired data, represented here by control signals W and V, as described above, would likely change much less often than the input data D. Accordingly, transistors Q5-7 can have lower $f_t$. In fact, the $f_t$ of transistors Q5-7 can be lower than $1/10^{th}$ of the $f_t$ of transistors Q1-4.

In an embodiment, the circuit 60 can include a resistor R3 coupled between the fifth node N5 and a power supply terminal Vee. Here, the resistor R3 can function as the current source 22 of FIG. 1. That is, current passing through resistor R3 can be provided to the differential pair formed by transistors Q5 and Q6 and to transistor Q7, forming part of the bias circuit 20.

In FIG. 2, the bias circuit 20 includes resistor R4, transistor Q7 and voltage source V1. In an embodiment, voltage source V1 can be selected to have an output voltage that is substantially between the voltages representing the logic levels of control signals W and V. For example, voltage source V1 can be configured to generate a voltage that is about half way between a high logic level and a low logic level of control signals W and V.

Accordingly, when one of control signals W and V are asserted in a high state, the corresponding transistor of transistors Q5 and Q6 will be conducting while the other will be turned off. In addition, when either of the control signals W and V are asserted in a high state, that high state is higher than the voltage of voltage source V1. Accordingly, transistor Q7 is turned off. In addition, if a do-not-care signal X is asserted as described above, control signals W and V can both be in a low state. Accordingly, transistor Q7 will conduct as the voltage of the voltage source V1 will be higher than the control signals W and V.

It should be noted that in this embodiment, the output logic levels will not be the same when the do-not-care signal X is asserted. For example, when either control signals W or V is asserted, it will be higher than the voltage of voltage source V1. A corresponding current will flow due to the voltage on node N5 generated across R3. However, when the lower level of the voltage source V1 is causing transistor Q7 to conduct, a smaller voltage will be generated on node N5 across resistor R3. Accordingly, the current passing through resistor R3 will be less. As the voltage swing on the output at node N1 is dependent on the current passing through the resistor R3, the voltage levels will be different when the do-not-care signal X is asserted and when it is not.

Such a difference in voltage levels can introduce a skew and/or delay between outputs of other word recognizer elements. For example, with the smaller amount of current, the switch can take longer to occur. Moreover, as described above, if transistor Q7 has a lower $f_t$, a switch can take longer. As a result, a transition can occur at a later time. Moreover, as the signal level is lower, any subsequent stages will have a lower drive level, potentially introducing further delay. However, although such a delay may be introduced, as it is associated with an asserted do-not-care signal X, thus the effect can be negligible, if not non-existent.

In an embodiment, a resistor R4 is coupled between the seventh transistor Q7 and the first node N1. Resistor R4 can be selected to provide an amount of isolation of node N1 from the loading of transistor Q7. For example, resistors R1 and R2 may be 50 ohm resistors forming a part of the source impedance of the circuit 60. Resistor R4 can be selected to be larger than 50 ohms. Accordingly, any parasitic effect of transistor Q7 can be reduced.

In an embodiment, a variable capacitance can be coupled between nodes N1 and N3. Accordingly, a variable delay can be introduced into the switching time of node N1 and N3. In this embodiment, the variable capacitance can be formed by diodes D1 and D2 coupled to nodes N1 and N3. A skew control voltage can be applied to a common node of diodes D1 and D2 such that diodes D1 and D2 can be operated as varactors.

Accordingly, in an embodiment, multiple functions can be enabled in the circuit 60. First, a comparison of input data D with desired data P can be performed. Second, the comparison can be passed or ignored using a do-not-care signal X. Third, a skew of the output at node Ni can be controlled. Note that in this embodiment, there is only one switching transistor pair between the input data D and the output at node N1. Accordingly, the delay of the circuit 60 would be substantially equivalent to a single gate delay. That is, the above functions are implemented in a single circuit 60 with a single gate delay.

As circuitry has become more and more integrated, more functionality has been added to a single integrated circuit. However, adding the circuit 60 to an integrated circuit would incur the additional time and cost of an entire redesign. In an embodiment, circuit 60 can be implemented with discrete transistors, resistors, and the like. Accordingly, no redesign of an integrated circuit is necessary. Moreover, as described above, additional functionality can be implemented.

Figure 3:
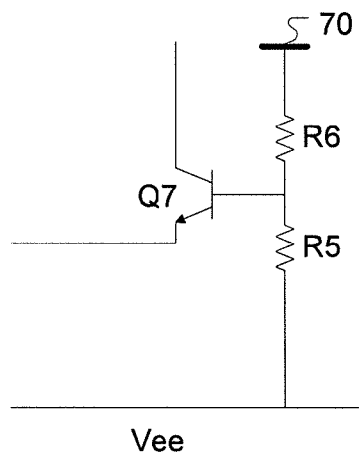
FIG. 3 is a schematic of an example of a bias circuit of the multifunction word recognizer element of FIG. 2.

FIG. 3 is a schematic of an example of a bias circuit of the multifunction word recognizer element of FIG. 2. The bias circuit includes the seventh transistor Q7, and resistor R5 and R6. Resistor R5 and R6 are coupled between the power supply Vee and a second power supply 70. Accordingly, resistors R5 and R6 form the output of voltage source V1. Transistor Q7 is responsive to the voltage between resistors R5 and R6.

Resistors R5 and R6 further emphasize the potential simplicity of the word recognizer element according to an embodiment. For example, the voltage source V1 can be implemented with two discrete resistors R5 and R6. As described above the voltage of voltage source V1 can be a substantially fixed voltage. Accordingly, no additional circuitry allowing the voltage to be changed according to some control signal or other input is needed.

Although particular designations have been given for power supplies, such as Vcc, Vee, or the like, the power supplies can be configured as appropriate to the transistors, logic levels, or the like of the circuitry.

Figure 4:
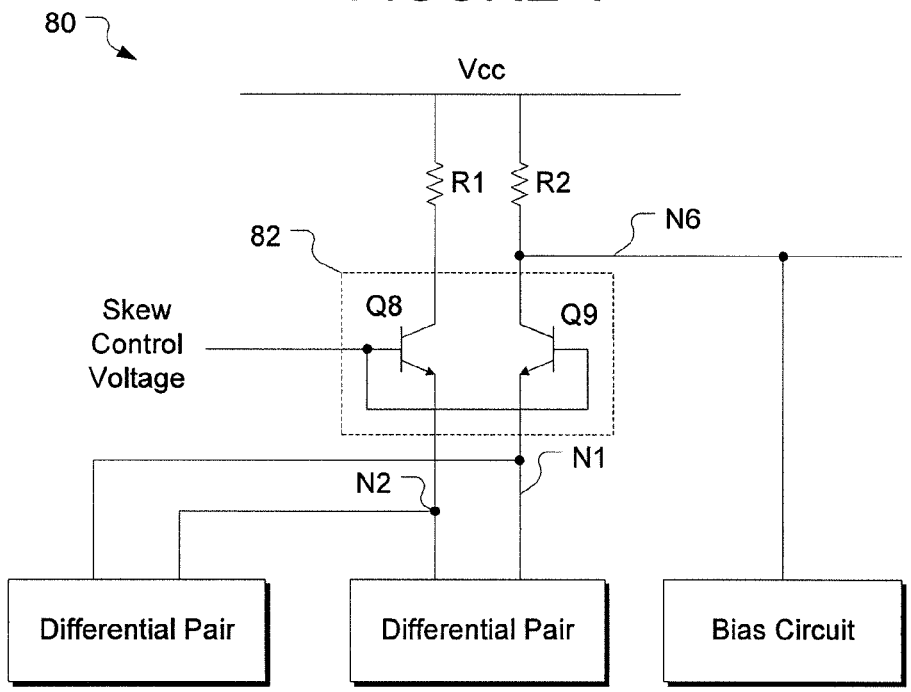
FIG. 4 is a schematic of a multifunction word recognizer element with a variable delay according to an embodiment.

FIG. 4 is a schematic of a multifunction word recognizer element with variable delay according to an embodiment. For simplicity, some additional elements of a word recognizer of FIG. 1 have been omitted. In this embodiment, a cascode transistor stage 82 formed by transistors Q8 and Q9 is coupled between the load formed by resistors R1 and R2, and the first differential pair and the second differential pair at nodes N1 and N2. A skew control voltage can be applied to the transistors Q8 and Q9. Accordingly, transistors Q8 and Q9 can introduce a variable capacitance to the load of resistors R1 and R2 and allow for control of delay and/or skew as described above. In this embodiment, node N6 is an output node between the cascode transistor stage 82 and the load of resistors R1 and R2. The bias circuit is coupled to node N6 so that it can pull node N6 according to a do-not-care signal X, as described above.

Figure 5:
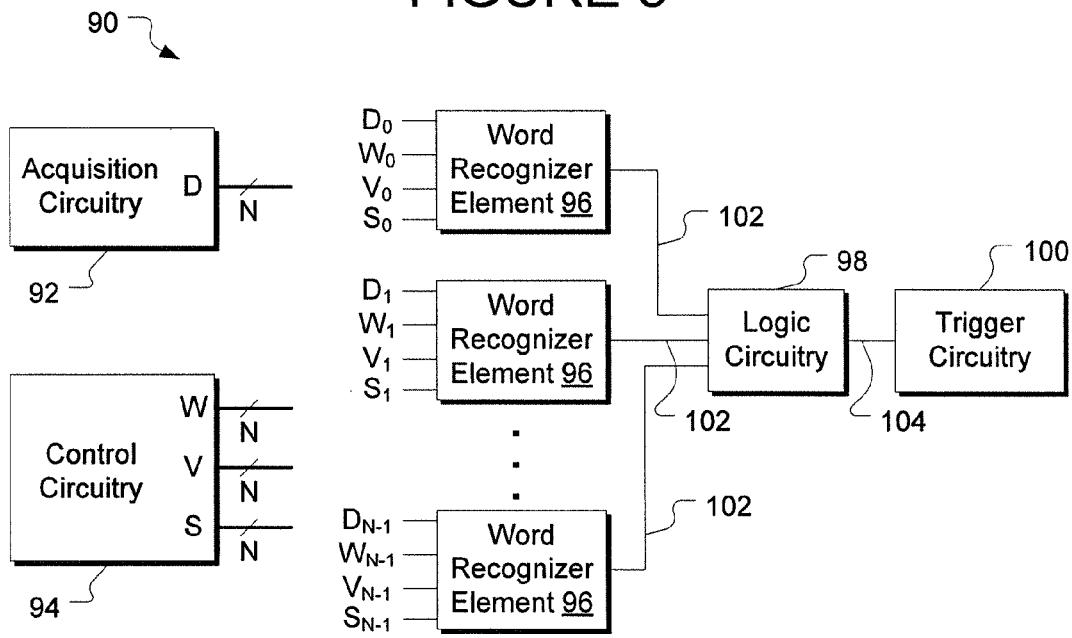
FIG. 5 is a block diagram of a test and measurement instrument with a multifunction word recognizer according to an embodiment.

FIG. 5 is a block diagram of a test and measurement instrument with a multifunction word recognizer according to an embodiment. The test and measurement instrument 90 includes acquisition circuitry 92, control circuitry 94, word recognizer elements 96, logic circuitry 98, and trigger circuitry 100.

The acquisition circuitry 92 is configured to acquire multiple data signals D. In this embodiment, there are N data signals. The acquisition circuitry 92 can include any variety of probes, buffers, comparators, or the like that generate the data signals D suitable for a word recognizer. Each word recognizer element 96 is configured to compare a corresponding one of the data signals D with a desired data bit and has a delay less than or equal to about one gate delay. Each desired data bit and a corresponding do-not-care signal can be represented by control signals W and V, as described above.

The control circuitry 94 is configured to generate the control signals W and V for the word recognizers 96. Here, there are N of each of the control signals W and control signals V. In an embodiment, the control circuitry 94 can combine the desired data bits and do-not-care signals to create the control signals W and V as described above. Each word recognizer element 96 is responsive to a corresponding one of the control signals W and a corresponding one of the control signals V.

The logic circuit 98 is configured to combine the word recognizer outputs 102 to generate a recognized word signal 104. In an embodiment, the logic circuit 98 can be a multi-input logic gate, such as a NOR gate, an AND gate, or the like, to combine the word recognizer outputs 102 together.

Although an example of logic used to generate the control signals W and V has been described above, such logic can be inverted, the outputs of a word recognizer element 96 can be inverted, or the like. Accordingly, the logic circuit 98 can be appropriately configured to combine the particular logic levels output from the word recognizer elements 96.

The trigger circuitry 100 is responsive to the logic circuit 98. For example, the trigger circuitry 100 can use the recognized word signal 104 to trigger an acquisition. The trigger circuitry 100 can be any variety of circuitry that can be part of a triggering system of the test and measurement instrument 90.

The control circuitry 94 can also be configured to generate a multiple skew control voltages S. Each word recognizer element 96 can have a corresponding input for one of the skew control voltages S. As described above, a delay of the word recognizer element 94 can be responsive to the corresponding skew control voltage S.

Although embodiments have been described above as having no explicit do-not-care signal X, a do-not-care signal X can be applied, such as being applied to the bias circuit 20 of FIG. 1. In an embodiment, the bias circuit 20 can be configured such that current from the current source 22 is diverted from the third differential pair 18 to the bias circuit 20 in response to the do-not-care signal X. For example, the do-not-care signal X can have an asserted level that is higher than a high level of either control signals W and V. Thus, regardless of their state, a do-not-care output will be output from the word recognizer element.

Moreover, in such a configuration, control signals W and V can be the desired data P and the inverted desired data /P. That is, even though an additional do-not-care control signal X is used, only one additional control signal is needed as the control signals W and V would become the inverse of each other.

Although particular embodiments have been described, it will be appreciated that the principles of the invention are not limited to those embodiments. Variations and modifications may be made without departing from the principles of the invention as set forth in the following claims.

What is claimed is:

1. A circuit, comprising:
   a load;
   a first differential pair coupled to the load and responsive to input data;
   a second differential pair coupled to the load and responsive to the input data;
   a third differential pair coupled to the first differential pair and the second differential pair and responsive to a first control signal and a second control signal;
   a bias circuit configured to pull a node coupled to both the first differential pair and the second differential pair to a predetermined state;
   a current source coupled to the third differential pair and the bias circuit; and
   control circuitry configured to generate the first control signal and the second control signal in response to a do-not-care signal and a desired data signal, wherein the control circuitry is configured to generate the first control signal by performing a logical AND operation on an inverse of the do-not-care signal and the desired data signal.

2. The circuit of claim 1, wherein the current source includes a resistor coupled between a power supply node and a node coupled to both the third differential pair and the bias circuit.

3. The circuit of claim 1, wherein the bias circuit comprises:
   a voltage source; and
   a transistor coupled between the current source and the node coupled to both the first differential pair and the second differential pair;
   wherein the transistor is responsive to a voltage of the voltage source.

4. The circuit of claim 3, wherein the bias circuit further comprises a resistor network coupled to a power supply and the transistor.

5. The circuit of claim 3, wherein the voltage source is configured to generate the voltage at a level substantially between a first logic level of the first control signal and a second logic level of the first control signal.

6. The circuit of claim 1, further comprising a variable capacitor coupled to the load.

7. The circuit of claim 6, wherein:
   the load includes a first node and a second node;
   the variable capacitor is coupled between the first node and the second node; and
   the first differential pair and the second differential pair are cross-coupled to the first node and second node.

8. The circuit of claim 1, further comprising:
   a cascode transistor stage coupled between the load, and the first differential pair and the second differential pair; and
   a variable capacitance coupled to the load and the cascode transistor stage.

9. The circuit of claim 1, wherein the first differential pair and the second differential pair are both responsive to a data signal and a complementary data signal of the input data.

10. The circuit of claim 1, wherein the control circuitry is configured to generate the second control signal by performing a logical AND operation on the inverse of the do-not-care signal and an inverse of the desired data signal.

11. A circuit, comprising:
    a first transistor coupled between a first node and a second node and responsive to a data signal;
    a second transistor coupled between a third node and the second node and responsive to an inverted data signal;
    a third transistor coupled between the third node and a fourth node and responsive to the data signal;
    a fourth transistor coupled between the first node and the fourth node and responsive to the inverted data signal;
    a fifth transistor coupled between the second node and a fifth node and responsive to a first control signal;
    a sixth transistor coupled between the fourth node and the fifth node and responsive to a second control signal;
    a seventh transistor coupled between the first node, the fifth node, and a voltage source, and
    control circuitry configured to generate the first control signal and the second control signal in response to a do-not-care signal and a desired data signal, wherein the control circuitry is configured to generate the first control signal by performing a logical AND operation on an inverse of the do-not-care signal and the desired data signal.

12. The circuit of claim 11, wherein transition frequencies of the fifth, sixth, and seventh transistors are less than half of transition frequencies of the first through fourth transistors.

13. The circuit of claim 11, further comprising a resistor coupled between the seventh transistor and the first node.

14. The circuit of claim 11, further comprising a resistor coupled between the fifth node and a power supply terminal.

15. The circuit of claim 11, further comprising a variable capacitor coupled between the first node and the third node.

* * * * *